(12) United States Patent
Henn et al.

(10) Patent No.: US 10,076,035 B2
(45) Date of Patent: Sep. 11, 2018

(54) MINIATURIZED MULTI-PART COMPONENT AND METHOD FOR PRODUCING SAME

(71) Applicant: Snaptrack Inc., San Diego, CA (US)

(72) Inventors: Gudrun Henn, Ebenhausen (DE); Marcel Giesen, Munich (DE)

(73) Assignee: SnapTrack, Inc., San Diego, CA (US)

(*) Notice: Subject to any disclaimer, the term of this patent is extended or adjusted under 35 U.S.C. 154(b) by 298 days.

(21) Appl. No.: 14/772,587

(22) PCT Filed: Jan. 29, 2014

(86) PCT No.: PCT/EP2014/051710
§ 371 (c)(1),
(2) Date: Sep. 3, 2015

(87) PCT Pub. No.: WO2014/135311
PCT Pub. Date: Sep. 12, 2014

(65) Prior Publication Data
US 2016/0014902 A1    Jan. 14, 2016

(30) Foreign Application Priority Data

Mar. 6, 2013   (DE) .......... 10 2013 102 223

(51) Int. Cl.
*H05K 1/18* (2006.01)
*H05K 3/10* (2006.01)
(Continued)

(52) U.S. Cl.
CPC .......... *H05K 1/181* (2013.01); *H03H 9/0542* (2013.01); *H03H 9/0547* (2013.01);
(Continued)

(58) Field of Classification Search
CPC ........ H05K 1/181; H05K 3/3421; H05K 3/10; H05K 3/303; H03H 9/0542; H03H 9/0547;
(Continued)

(56) References Cited

U.S. PATENT DOCUMENTS 7,443,270 B2 * 10/2008 Motai ................. H03H 3/02
310/312
8,432,236 B2    4/2013 Schmidhammer
(Continued)

FOREIGN PATENT DOCUMENTS

DE    102009014068 A1    9/2010
EP       2009710 A2    12/2008
(Continued)

OTHER PUBLICATIONS

International Search Report and Written Opinion—PCT/EP2014/051710—ISA/EPO—Apr. 22, 2014.
(Continued)

*Primary Examiner* — Nathan Milakovich
(74) *Attorney, Agent, or Firm* — Patterson & Sheridan, L.L.P.

(57) ABSTRACT

A component includes a carrier and a functional structure on the carrier. A thin-film cover covers the functional structure and is used as a mounting base for a circuit part, which is arranged over the thin-film cover. The circuit part is connected to the functional structure by means of a lead.

17 Claims, 2 Drawing Sheets

(51) Int. Cl.
*H03H 9/10* (2006.01)
*H03H 9/05* (2006.01)
*H05K 3/30* (2006.01)
*H05K 3/34* (2006.01)

(52) U.S. Cl.
CPC ........ *H03H 9/0566* (2013.01); *H03H 9/1007* (2013.01); *H03H 9/1057* (2013.01); *H03H 9/1064* (2013.01); *H05K 3/10* (2013.01); *H05K 3/303* (2013.01); *H05K 3/3421* (2013.01)

(58) Field of Classification Search
CPC .. H03H 9/0566; H03H 9/1007; H03H 9/1064; H03H 9/1057
See application file for complete search history.

(56) References Cited

U.S. PATENT DOCUMENTS

| | | | | |
|---|---|---|---|---|
| 8,940,359 | B2* | 1/2015 | Eggs | H01L 41/23 427/100 |
| 9,876,158 | B2* | 1/2018 | Henn | H01L 41/0533 |
| 2003/0155643 | A1* | 8/2003 | Freidhoff | B81C 1/00293 257/704 |
| 2004/0189147 | A1* | 9/2004 | Ito | H03H 9/02921 310/313 B |
| 2009/0001849 | A1 | 1/2009 | Tsuda | |
| 2010/0225202 | A1 | 9/2010 | Fukano et al. | |
| 2011/0221546 | A1 | 9/2011 | Yamaji et al. | |
| 2011/0266917 | A1* | 11/2011 | Metzger | H03H 3/02 310/313 A |
| 2012/0299131 | A1* | 11/2012 | Henn | B81C 1/00293 257/416 |
| 2013/0342079 | A1* | 12/2013 | Schmidhammer | H03H 9/02 310/334 |
| 2013/0343028 | A1* | 12/2013 | Henn | H03H 9/105 361/814 |
| 2016/0020749 | A1* | 1/2016 | Henn | H03H 9/105 310/313 D |
| 2017/0267519 | A1* | 9/2017 | Schaufele | H03H 9/105 |

FOREIGN PATENT DOCUMENTS

| | | |
|---|---|---|
| JP | 5991719 A | 5/1984 |
| JP | 2001217674 A | 8/2001 |
| JP | 200910121 A | 1/2009 |
| JP | 2009010121 A | 1/2009 |
| JP | 2009010559 A | 1/2009 |
| JP | 2011160024 A | 8/2011 |

OTHER PUBLICATIONS

Gillot, C., et al., "Wafer Level Thin Film Encapsulation for MEMS," IEEE 2005 Conference on High Density Microsystem Design and Packaging and Component Failure Analysis, Jun. 27-29, 2005, 4 pages.

Malmros, A., et al., "Combined TiN- and TaN temperature compensated thin film resistors," Thin Solid Films, vol. 520, Issue 6, Jan. 2012, pp. 2162-2164.

Pornin, J.L., et al., "Wafer Level Thin Film Encapsulation for BAW RF MEMS," ECTC '07 Proceedings, 57th Electronic Components and Technology Conference, May 29-Jun. 1, 2007, pp. 605-609.

* cited by examiner

MINIATURIZED MULTI-PART COMPONENT AND METHOD FOR PRODUCING SAME

This patent application is a national phase filing under section 371 of PCT/EP2014/051710, filed Jan. 29, 2014, which claims the priority of German patent application 10 2013 102 223.5, filed Mar. 6, 2013, each of which is incorporated herein by reference in its entirety.

TECHNICAL FIELD

The invention relates to components having more than one circuit part, which allow compact designs, and to a method for producing such components.

BACKGROUND

Electrical devices, for example, mobile communication devices, are experiencing a constant trend toward miniaturization so that more functions with small dimensions are available. Components which are installed in these devices are consequently also experiencing the trend towards miniaturization.

Reducing the size of components which contain circuit parts of different types is problematic. MEMS parts, for example, filters operating with acoustic waves, comprise functional structures and generally require more or less hermetically sealed cavities in which the functional structures are encapsulated.

It is known to arrange structures of acoustically active filters on a chip and to attach and connect these to a multilayer substrate in a flip-chip arrangement. The multilayer substrate may contain further circuit parts of other types and may be connected to the structures on the chip. A cover over the chip encloses the chip on the multilayer substrate, a cavity optionally being formed between the chip and the substrate.

Another possibility for the encapsulation of MEMS structures consists of TFPs (TFP=Thin-Film Package) with a thin layer of a cover material as the cover.

SUMMARY

Embodiments of the present invention provide a component which comprises circuit parts of different types, has small dimensions, can be produced favorably and provides an optimally protected environment for sensitive functional structures. Further embodiments provide a method for producing such a component.

A component comprises a carrier and a first functional structure on the carrier. The component furthermore comprises a first thin-film cover over the functional structure and a first circuit part over the first thin-film cover. The first circuit part is connected to the first functional structure by means of a lead.

The carrier may be a chip, for example, comprising of silicon or a ceramic substrate. If the first functional structure is arranged directly on the carrier and it touches the carrier consisting of a conductive material, the carrier may comprise a high-impedance material.

The thin-film cover may comprise a layer of a TFP. According to the choice of the material and of the thickness of the thin-film cover, optimal hermeticity may be established. To this end, the thin-film cover may end tightly with the carrier and be shaped in such a way that there is a cavity, in which the first functional structure is arranged, between the thin-film cover and the cavity.

The first functional structure may, for example, be an MEMS structure, which requires encapsulation from the surroundings. It is possible for the first functional structure to be arranged in the cavity in such a way that it does not touch the thin-film cover. If the first functional structure is acoustically active, contact with the thin-film cover would interfere with the function of the structure.

The first circuit part is not encapsulated together with the functional structure by the thin-film cavity, but lies outside the cavity. In this way, it is not absolutely necessary for the functional structure and the first circuit part to have similar geometrical dimensions or for the cavity to be made large enough that the first circuit part can also be fitted therein. If the first circuit part is much larger than the first functional structure, then the cavity can be made so small, matching the first functional structure, that good mechanical stability of the thin-film cover is obtained, the stability increasing inter alia with a cavity of decreasing size. In this way, the thin-film cover can also form a stable base for the circuit part arranged thereon.

The lead, comprising an electrically conductive material, may be fed under the thin-film cover without compromising the hermeticity.

The component may also comprise further functional structures in addition to the first functional structure and further circuit parts in addition to the first circuit part.

In one embodiment, the first functional structure is selected from an MEMS structure, a microacoustic structure, a SAW structure (SAW=Surface Acoustic Wave), a BAW structure (BAW=Bulk Acoustic Wave), a GBAW structure (GBAW=Guided Bulk Acoustic Wave). The first circuit part is selected from an inductive element, a capacitive element, a resistive element, an SMD (SMD=Surface-Mounted Device) with an active circuit element. The active circuit part may comprise semiconductor switches such as transistors. Other active or passive circuit elements are likewise possible.

A component is therefore obtained in which circuit technologies of different types are integrated together. Essentially, the largest circuit part determines the external dimensions of the component, while the smallest parts can be fitted easily without significantly increasing the dimensions.

In one embodiment, the component furthermore comprises a connection pad on the carrier, which pad is connected to the lead and by means of which the first functional structure is connected to the first circuit part. The connection pad allows a conventional possibility of electrically conductive connection of the functional structure to the circuit part.

In one embodiment, the component furthermore comprises a further circuit part, or a plurality of further circuit parts, above the first functional structure and connected to the first functional structure. Circuit parts of the component may undertake impedance matching between different circuit groups of the component or may be used as ESD protection elements (ESD=Electrostatic Discharge) and, for example, be connected to a common antenna connection of a duplexer. It is also possible for the circuit parts or some of the circuit parts to carry out the impedance matching between transmission and reception filter stages.

In one embodiment, the component furthermore comprises further functional structures on the carrier. It is possible for the first thin-film cover to cover the further functional structures together with the first functional structure. It is also possible for one or more further thin-film covers to cover the further functional structures.

The component may thus contain a multiplicity of different functional structures, which are arranged together in a cavity or for which a specially adapted cavity is respectively provided individually or in groups.

In one embodiment, each of a multiplicity of functional structures operating with acoustic waves is respectively covered by their own thin-film cover and is connected to an RF filter. The first circuit part is an impedance matching element for the RF filter.

In one embodiment, the component is a transmission filter, a reception filter or a duplexer for use in a mobile communication device.

The mobile communication device profits from the size reduction of the design of the component, since the device itself can be made smaller and/or can offer a larger number of functions owing to the possibility of installing a larger number of components.

In one embodiment, the first circuit part is a thin-film resistor consisting of titanium nitride or tantalum nitride or a thin-film capacitor with at least one dielectric layer between two conductive layers.

Essentially, all materials which can be used for use with lithographic structuring may be used in order to form the functional structures, the thin-film cover and/or the circuit parts.

A method for producing a component comprises the steps:
providing a carrier,
arranging a first functional structure on the carrier,
covering the first functional structure with a thin-film cover,
forming a first circuit part on the thin-film cover, and
connecting the first circuit part to the first functional structure.

In one embodiment of the method, in order to form the first circuit part, a metal layer is deposited on the thin-film cover and is structured. The deposition of the metal layer produces simultaneously with the formation a conductive contact between the material of the first circuit part and a lead to the first functional structure.

BRIEF DESCRIPTION OF THE DRAWINGS

The component will be explained in more detail below with the aid of exemplary embodiments and schematic figures, in which.

DETAILED DESCRIPTION OF ILLUSTRATIVE EMBODIMENTS

Figure 1:
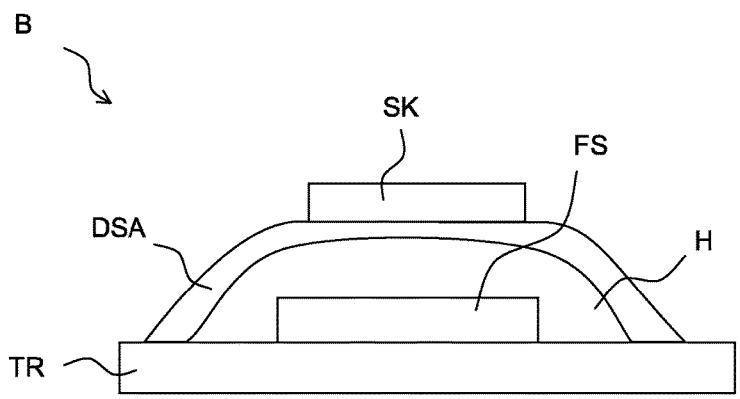
FIG. 1 shows a component B having a functional structure FS in a cavity below a circuit part SK.

FIG. 1 shows a cross section through a component B in which a functional structure FS is arranged on a carrier TR. The functional structure FS may be fastened on the carrier TR by means of electrical contacts or holding elements, or directly. In particular, it is possible for the functional structure FS to be produced directly, for example, grown directly, on the carrier. Arranged above the functional structure FS, there is a thin-film cover DSA which encloses the functional structure FS in a cavity H. Arranged above the thin-film cover DSA, there is a circuit part or at least a portion of a circuit part SK. The use of thin-film covers in TFP technology allows small but stable cavities in which functional structures of MEMS (MEMS: Micro-Electro-Mechanical System) can be fitted while being hermetically isolated and protected from the surroundings.

Figure 2:
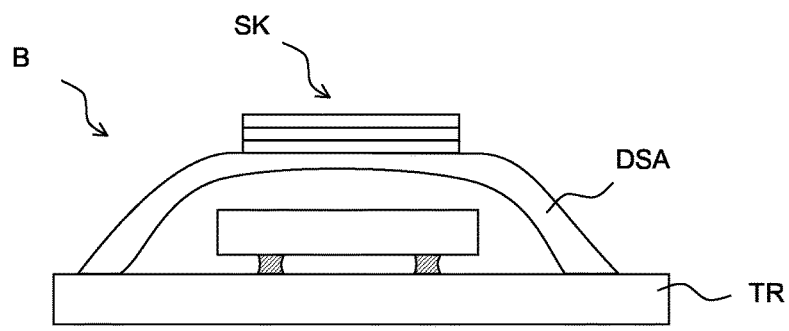
FIG. 2 shows a component B having a capacitive element as the circuit part.

FIG. 2 shows an embodiment of the component B in which the circuit part SK is configured as a capacitive element with a dielectric material between two electrically conductive surfaces.

Figure 3:
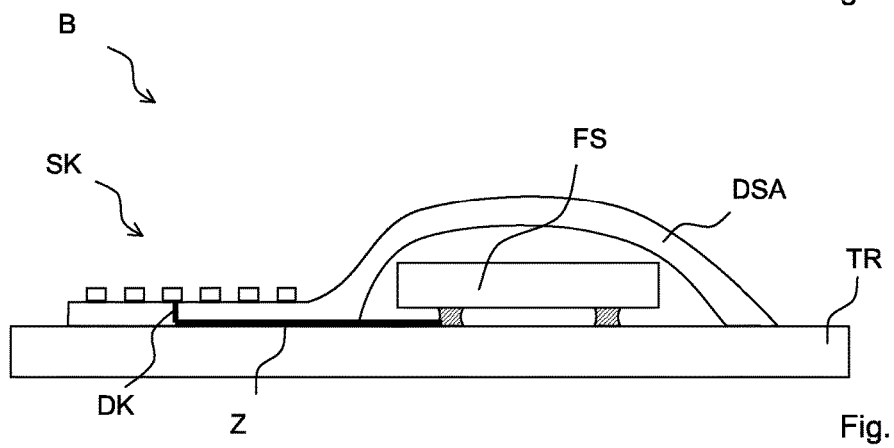
FIG. 3 shows a component having an inductive element as the circuit part.

FIG. 3 shows a component B in which the circuit part SK is configured as an inductive element, for example, as a coil. The circuit part SK is arranged above the thin-film cover DSA and, as seen laterally, next to the functional structure FS above the carrier TR. An electrical connection between the circuit part SK and the functional structure FS can be established by means of a lead Z, which connects an electrical contact of the functional structure FS to a conductive structure of the circuit part SK. The lead Z may in this case extend at least partially under the thin-film cover and directly on the carrier TR. It is possible for the lead Z to be fed through the thin-film cover DSA via a through-contact.

Figure 4:
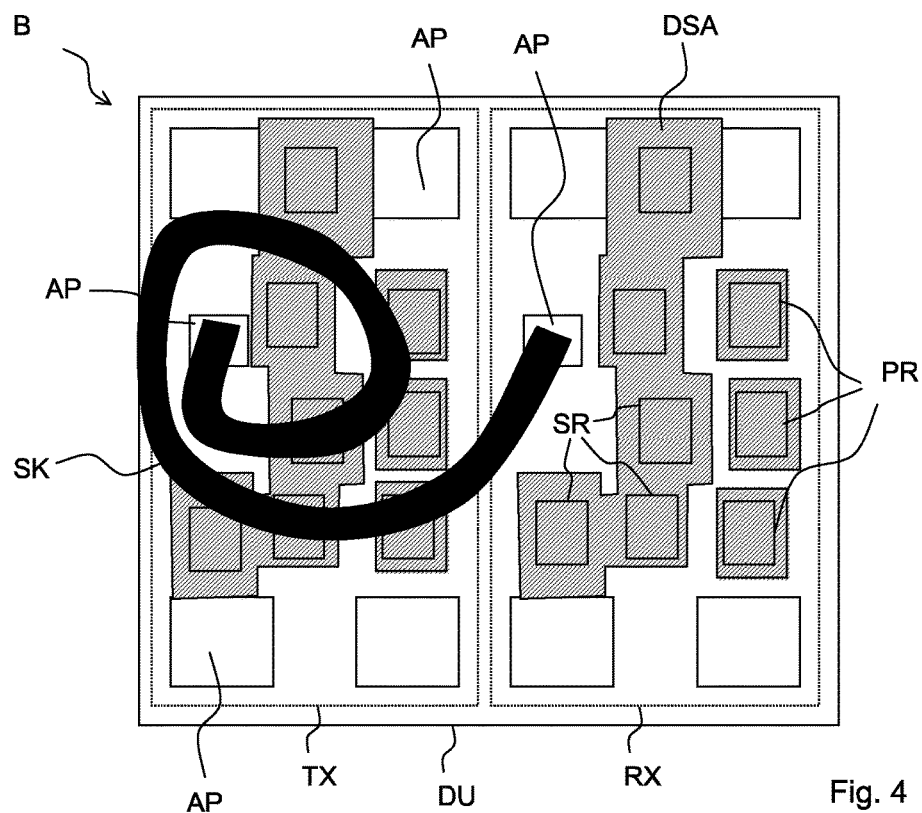
FIG. 4 shows a plan view of a component which is configured as a duplexer.

FIG. 4 shows a plan view of a component B which is configured as a duplexer. The duplexer DU comprises a transmission filter TX and a reception filter RX. A reception pad AP of the transmission filter TX and of the reception filter RX is respectively connected to the circuit part SK. The circuit part SK in the present case is configured as an inductive element in quasi-coil form with a number of turns of about 1.5.

Both the transmission filter TX and the reception filter RX comprise a multiplicity of parallel resonators PR and series resonators SR. The series resonators SR are respectively connected in series with one another in the signal path. Parallel resonators PR connect the signal path to ground. A ladder-type filter structure is obtained, which can operate as a bandpass filter or as a bandstop filter. Each resonator is encapsulated from the surroundings in a cavity below the thin-film cover DSA. The thin-film cover DSA is denoted by shading. The series resonators together have a single thin-film cover DSA, in which the resonators can be arranged together in a cavity or in different cavities below the common layer. Parallel resonators PR respectively have their own thin-film cover DSA with their own cavity. Via connection pads AP, the duplexer DU can be connected to an external circuit environment, for example, a front-end circuit of a mobile communication device.

Figure 5:
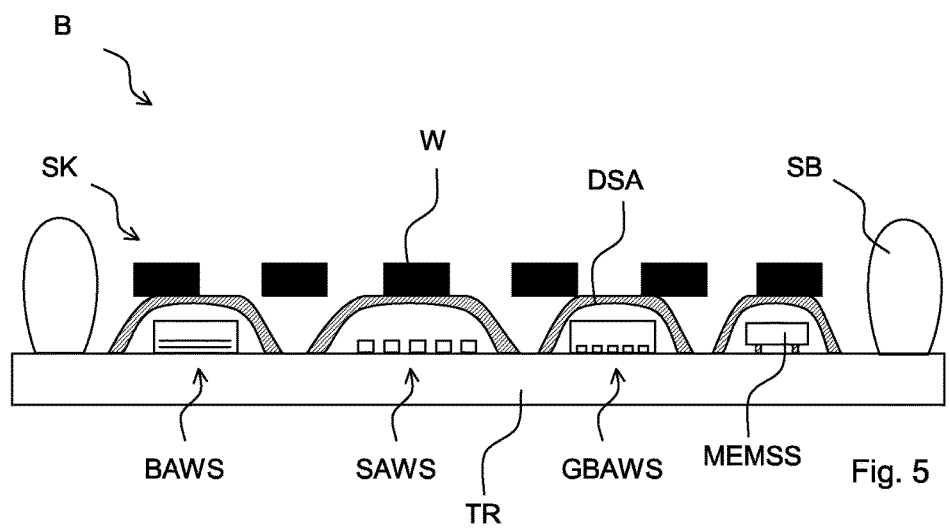
FIG. 5 shows a component having a plurality of functional structures, each with their own thin-film cover.

FIG. 5 shows component B with four cavities, each under a thin-film cover DSA. A functional structure is arranged in each cavity. One cavity comprises a BAW structure BAWS, a second cavity contains a SAW structure SAWS, a third cavity comprises a GBAW structure GBAWS and a fourth cavity comprises a MEMS structure MEMSS. The BAW structure, the SAW structure and the MEMS structure are arranged in the cavity without touching the thin-film cover DSA. The GBAW structure GBAWS may touch the thin-film cover DSA, since the waveguiding region is in any event covered by a material, so that the waveguiding region is acoustically decoupled from the thin-film cover DSA even if the thin-film cover bears fully on the GBAW structure GBAWS, which is possible in order to form a more stable base for the circuit parts, here in the form of a winding W. By means of solder connections, which may, for example, be implemented as a bump connection using solder beads SB, the component B can be connected to an external circuit environment.

The component and the method for producing the component are not restricted to the exemplary embodiments described or shown, the features of which may be combined with one another in any desired way in order to fulfill specific requirements. Embodiments with further layers and measures for encapsulating structures and use with multi-layer substrates as a carrier are likewise possible.

What is claimed is:

1. A component, comprising
    a carrier;
    a plurality of functional structures on the carrier;
    a plurality of thin-film covers, each of the plurality of thin-film covers being over a different one of the plurality of functional structures, wherein the plurality of functional structures comprises a microelectromechanical system (MEMS) structure, a microacoustic structure, a surface acoustic wave (SAW) structure, a bulk acoustic wave (BAW) structure, and a guided bulk acoustic wave (GBAW) structure; and
    a circuit part over one of the plurality of thin-film covers, wherein the circuit part is connected to a functional structure of the plurality of functional structures by a lead.

2. The component according to claim 1, wherein
    the circuit part comprises an element selected from a group of elements consisting of an inductive element, a capacitive element, a resistive element, and a surface-mount device (SMD) with an active circuit element.

3. The component according to claim 1, further comprising a connection pad on the carrier, the connection pad being connected to the lead such that the functional structure of the plurality of functional structures is connected to the circuit part by the connection pad.

4. The component according to claim 1, further comprising a plurality of further functional structures on the carrier.

5. The component according to claim 4, wherein one of the plurality of thin-film covers covers the plurality of further functional structures together with the functional structure of the plurality of functional structures.

6. The component according to claim 4, further comprising one or more further thin-film covers covering the plurality of further functional structures.

7. The component according to claim 1, wherein:
    the plurality of functional structures are connected to a radio-frequency (RF) filter; and
    the circuit part is an impedance matching element for the RF filter.

8. The component according to claim 7, wherein the component comprises a transmission filter, a reception filter or a duplexer for use in a mobile communication device.

9. The component according to claim 1, wherein the circuit part is a thin-film resistor that comprises titanium nitride or tantalum nitride.

10. The component according to claim 1, wherein the circuit part is a thin-film capacitor with a dielectric between two conductive layers.

11. The component according to claim 1, wherein the circuit part vertically overlies the functional structure of the plurality of functional structures.

12. The component according to claim 1, wherein the circuit part is laterally spaced from the functional structure of the plurality of functional structures.

13. A method for producing a component, the method comprising:
    arranging a plurality of functional structures on a carrier;
    covering each of the plurality of functional structures with a different one of a plurality of thin-film covers, each of the plurality of thin-film covers being over a different one of the plurality of functional structures;
    forming a circuit part on one of the plurality of thin-film covers, wherein the plurality of functional structures comprises a microelectromechanical system (MEMS) structure, a microacoustic structure, a surface acoustic wave (SAW) structure, a bulk acoustic wave (BAW) structure, and a guided bulk acoustic wave (GBAW) structure; and
    electrically connecting the circuit part to a functional structure of the plurality of functional structures.

14. The method according to claim 13, wherein forming the circuit part comprises depositing a metal layer on the one of the thin-film covers and structuring the metal layer.

15. The method according to claim 14, wherein depositing the metal layer simultaneously forms a metal for a conductive contact between material of the circuit part and a lead to the functional structure of the plurality of functional structures.

16. A component, comprising:
    a carrier;
    a plurality of functional structures on the carrier, wherein each functional structure comprises a structure selected from the group consisting of a MEMS structure, a microacoustic structure, a SAW structure, a BAW structure, and a GBAW structure;
    a plurality of thin-film covers, each thin-film cover overlying at least one of the functional structures, wherein the plurality of functional structures comprises a MEMS structure, a SAW structure, a BAW structure, and a GBAW structure, each of the plurality of functional structures covered by a different thin-film cover; and
    a circuit part overlying one of the thin-film covers and being electrically connected to a functional structure of the plurality of functional structures, wherein the circuit part comprises an element selected from the group consisting of an inductive element, a capacitive element, and a resistive element.

17. The component according to claim 16, wherein the circuit part comprises a coil that overlies each of the different thin-film covers.

* * * * *